United States Patent [19]

Haraguchi et al.

[11] Patent Number: 5,677,889
[45] Date of Patent: Oct. 14, 1997

[54] STATIC TYPE SEMICONDUCTOR DEVICE OPERABLE AT A LOW VOLTAGE WITH SMALL POWER CONSUMPTION

[75] Inventors: Yoshiyuki Haraguchi; Tadato Yamagata, both of Hyogo, Japan

[73] Assignee: Mitsubishi Denki Kabushiki Kaisha, Tokyo, Japan

[21] Appl. No.: 517,030

[22] Filed: Aug. 18, 1995

[30] Foreign Application Priority Data

Aug. 30, 1994 [JP] Japan .................. 6-204978

[51] Int. Cl.⁶ ........................................ G11C 7/00
[52] U.S. Cl. ........................... 365/226; 365/189.09
[58] Field of Search ................... 365/226, 189.09, 365/227, 189.11

[56] References Cited

U.S. PATENT DOCUMENTS

| | | | |
|---|---|---|---|
| 4,638,465 | 1/1987 | Rosini et al. | 365/226 X |
| 5,046,052 | 9/1991 | Miyaji et al. | 365/226 |
| 5,327,388 | 7/1994 | Kobayashi | 365/189.09 |
| 5,341,340 | 8/1994 | Hagura | 365/226 |
| 5,363,333 | 11/1994 | Tsujimoto | 365/189.09 |
| 5,373,477 | 12/1994 | Sugibayashi | 365/226 |

FOREIGN PATENT DOCUMENTS 3-218667  9/1991  Japan .
5-120882  5/1993  Japan .

*Primary Examiner*—Joseph A. Popek
*Attorney, Agent, or Firm*—Lowe, Price, LeBlanc & Becker

[57] ABSTRACT

An SRAM includes a memory cell array, a peripheral circuitry including a bit line load connected to the memory cell array, a multiplexer and the like, and a voltage lowering circuit. The voltage lowering circuit receives a power supply potential Vcc and outputs a potential Vin which is lower. The potential Vin is applied to the peripheral circuitry except the memory cell array, and the power supply potential Vcc is directly applied to the memory cell array. Therefore, operational potential of the memory cell array is made relatively higher with respect to the peripheral circuitry. As a result, a static semiconductor memory device which can operation at low voltage and consumes less power can be provided.

10 Claims, 4 Drawing Sheets

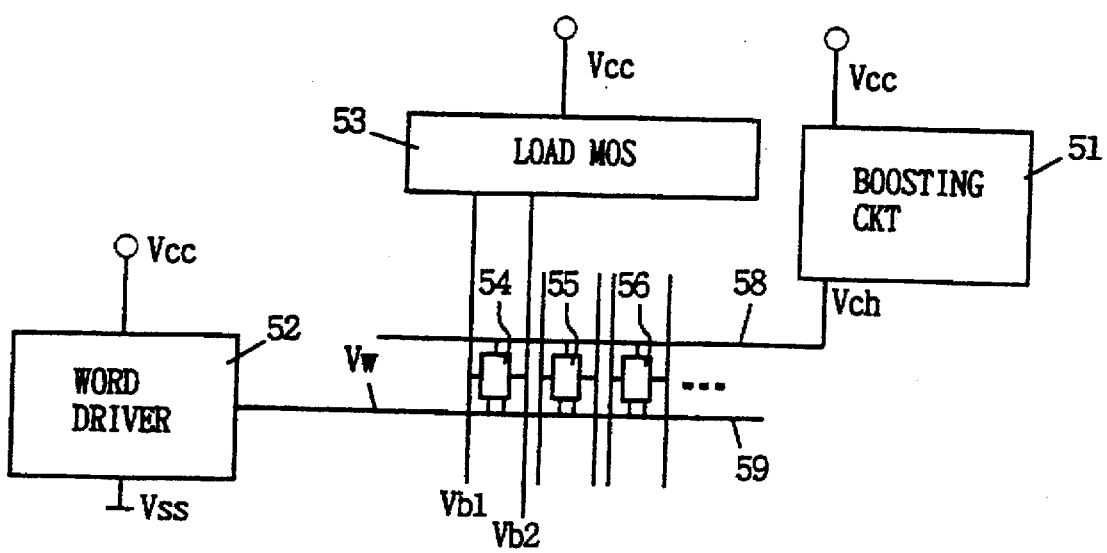
FIG. 5A PRIOR ART
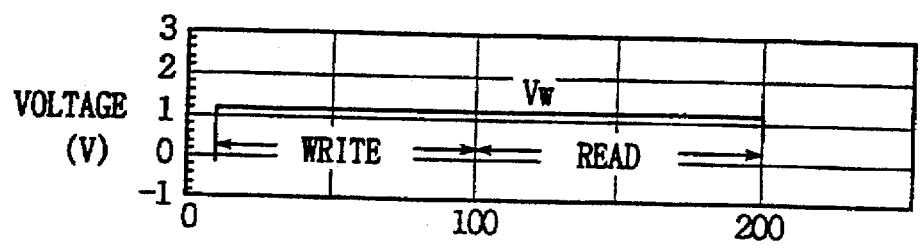
FIG. 5B(1) PRIOR ART
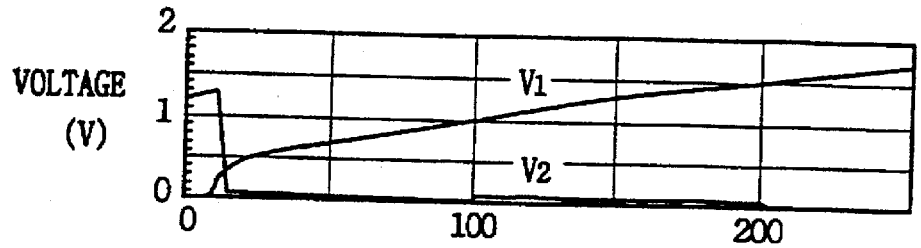
FIG. 5B(2) PRIOR ART
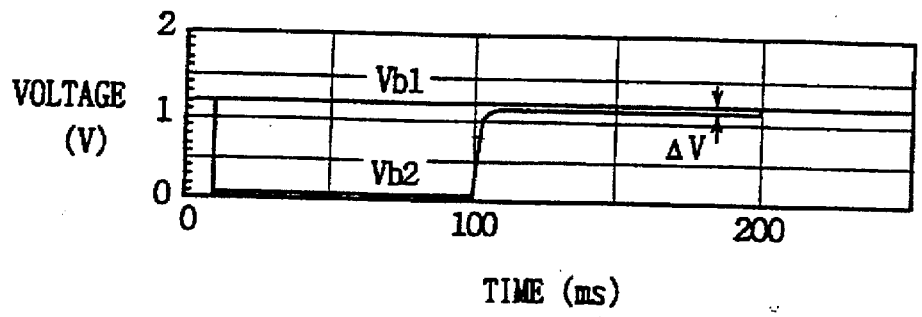
FIG. 5B(3) PRIOR ART

STATIC TYPE SEMICONDUCTOR DEVICE OPERABLE AT A LOW VOLTAGE WITH SMALL POWER CONSUMPTION

BACKGROUND OF THE INVENTION

1. Field of the Invention

The present invention relates to a static semiconductor memory device and, more specifically, a static semiconductor memory device (hereinafter referred to as "SRAM") which is operable at low voltage.

2. Description of the Background Art

An SRAM of interest to the present invention is disclosed, for example, in Japanese Patent Laying-Open No. 5-120882. FIGS. 5A and 6 are schematic diagrams showing the structure of the SRAM disclosed in this laid open application. Referring to FIG. 5, the conventional SRAM includes a load MOS 53 to which a power supply voltage Vcc is applied; a plurality of pairs of bit lines Vb1, Vb2 and so on connected to load MOS 53; memory cells 54 to 56 of TFT (Thin Film Transistor) type connected to the bit line pairs Vb1, Vb2, to a memory cell power supply line 57 and to a word line VW; a word driver 52 connected to the word line VW; and a boosting circuit 51 connected to memory cell power supply line 57 and outputting a boosted voltage Vch obtained by boosting the power supply voltage Vcc. Referring to FIG. 5, in the conventional SRAM, the voltage Vch boosted to be higher than the power supply voltage Vcc by means of boosting circuit 51 has been directly applied to memory cell power supply line 57, that is, one electrode of a load element of the memory cell.

FIG. 6 is a schematic diagram showing structures of the TFT type memory cells 54 to 56 shown in FIG. 5A. Referring to FIG. 6, the TFT type SRAM employs a TFT type memory cell in which thin film transistors (TFT) T1 and T2 are stacked on four NMOSFETs N1 to N4. In the SRAM memory cell of this type, a memory cell of the SRAM can be implemented in an area equivalent to a high resistance type memory cell, and operation at lower voltage than the high resistance type memory cell is possible thanks to the current of TFT.

FIGS. 5B(1) to 5B(3) show operation waveforms at various positions shown in FIG. 6 in various operation states of the memory cell. These waveforms are simulation waveforms when power supply voltage Vcc is at 1.2 V and the boosted voltage Vch is 1.8 V. As shown in the waveforms of FIGS. 5B(1) to 5B(3), at the time of writing, a voltage of Vcc-Vth is written to the node V1 in the memory cell. Thereafter, by the function of TFT in the load element which comes to have larger current drivability because of increase power supply voltage, V1 is charged to be higher than Vcc-Vth. Therefore, by the time reading operation starts, the memory cell node V1 has attained sufficiently high voltage, and as a result, sufficiently large operation signal (ΔV) can be taken out at the bit lines in reading, so that this voltage can be sufficiently amplified by a sense amplifier.

The static type semiconductor memory device operable at low voltage and employing high resistance type or TFT type memory cells which allows reduction in memory area has been structured as described above. Boosting circuit 51 is provided in the semiconductor memory device, of which voltage is applied to the TFT to increase current drivability of the TFT. Accordingly, the voltage at "H" (high) of the memory cell at the time of writing can be rapidly charged and increased by the TFT, the operation of the SRAM becomes possible at a voltage as low as 2 V or below, for example.

However, such a conventional static semiconductor memory device suffers from a problem that current consumption is large, as it includes a boosting circuit.

SUMMARY OF THE INVENTION

Therefore, an object of the present invention is to enable operation at a low voltage and to reduce power consumption, in a static semiconductor memory device having small memory cell area.

Another object of the present invention is to reduce power consumption by a simple structure, in a static semiconductor memory device having small memory area.

A still further object of the present invention is to provide a boosting circuit only at a necessary portion, in a static semiconductor memory device having a small memory cell area. The above described objects of the present invention can be attained by a static type semiconductor memory device including a static type memory cell constituted by MOS transistors, a peripheral circuit unit operating the static type memory cell, and a circuitry for preparing a second potential lower than a first potential, as a voltage to be applied to the peripheral circuit unit.

In the static semiconductor memory device, the potential applied to the static type memory cell is lower than that applied to the peripheral circuitry. As a result, an SRAM which can operate at a low voltage and consume less power can be provided.

Preferably, in the static semiconductor memory device, a third potential higher than the first potential is prepared and the third potential is supplied to the static type memory cell at the time of reading.

The potential lower than the power supply voltage is applied to the peripheral circuit unit, and at the time of reading, the potential higher than the power supply potential is applied to the static type memory cell. On current of the transistor constituting the memory cell is seemingly increased only at the time of reading, thus improving stability of the memory cell. As a result, an SRAM which can operate at a low voltage, consumes less power and stability of which memory cell is improved can be provided.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5A is a schematic diagram showing a structure of a conventional SRAM.

FIGS. 5B(1) to 5B(3) are waveforms of operation of the conventional SRAM of FIG. 5A.

DESCRIPTION OF THE PREFERRED EMBODIMENTS

Embodiments of the present invention will be described with reference to the figures.

(1) First Embodiment

Figure 1:
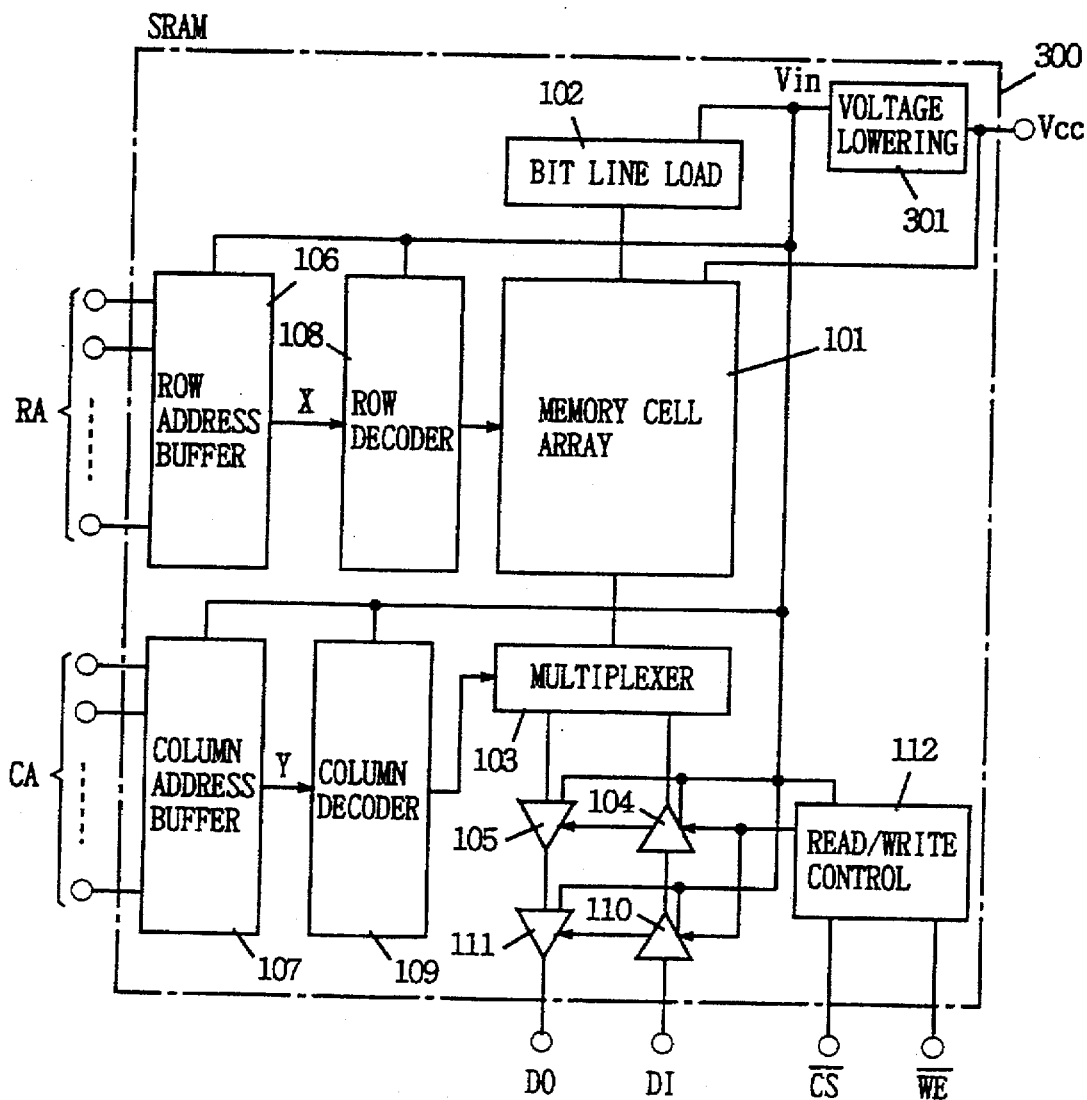
FIG. 1 is a block diagram of an SRAM in accordance with a first embodiment.
Figure 6:
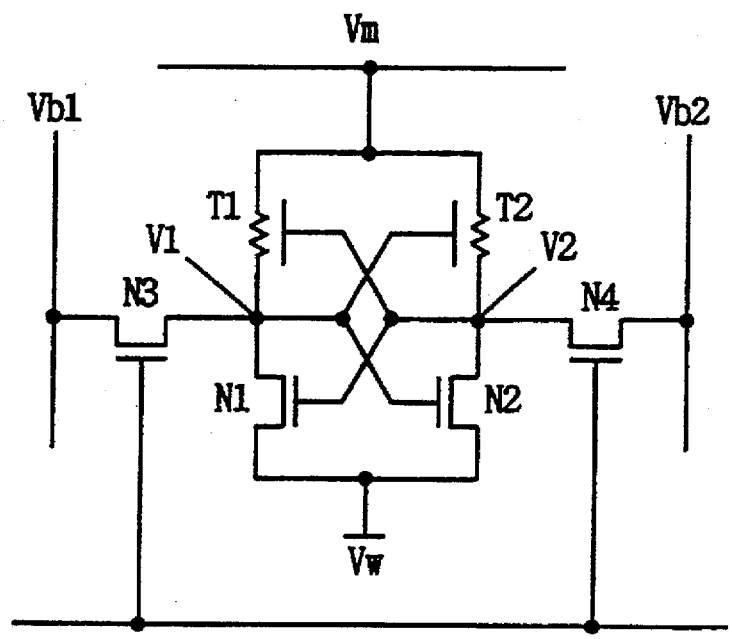
FIG. 6 is a schematic diagram of a memory cell employing TFTs.

FIG. 1 is a block diagram of an SRAM showing a first embodiment of the present invention. Referring to FIG. 1, an SRAM 300 in accordance with the first embodiment includes a memory array 101 having memory cells arranged in a matrix of rows and columns (see FIG. 6); a bit line load circuit 102; a multiplexer 103 for selecting a bit line pair to be accessed. A write buffer 104 for data writing; a sense amplifier 105 for data reading; and a voltage lowering circuit 301 for lowering an externally applied power supply potential Vcc.

SRAM 300 further includes a row address buffer 106 receiving an externally applied row address signal RA; a column address buffer 107 receiving an externally applied column address signal CA; a row decoder 108 decoding the row address signal RA; a column decoder 109 decoding the column address signal CA; a data input buffer 110 receiving input data DI; a data output buffer 111 outputting output data signal DO; and a read/write control circuit 112 operating in response to an externally applied chip selection signal/CS (here the sign/indicates low active) and a write enable signal/WE.

In SRAM 300, bit line load circuit 102, multiplexer 103, write buffer 104, sense amplifier 105, row address buffer 106, column address buffer 107, row decoder 108, column decoder 109, data input buffer 109, data output buffer 110 and read/write control circuit 112 are connected to a potential Vin output from voltage lowering circuit 301 as power supply potential. Only the memory cell array 101 is connected to the power supply potential Vcc.

Voltage lowering circuit 301 lowers the externally applied Vcc and outputs a potential Vin which is lower than the power supply potential Vcc. As a result, to the memory array 101, externally applied power supply potential Vcc is applied as the power supply potential, and to other circuits, the potential Vin lower than the power supply potential Vcc is applied. Here, the lower potential Vin is about 3.6 V when the power supply potential Vcc is 5 V. The value of Vin may be lowered to about 3 V, which is the limit operational voltage of the peripheral circuitry.

Since the SRAM is structured as described above, only the power supply potential across the TFT constituting memory cell array 101 can be set higher than the peripheral circuitry. As a result, on current of TFT is seemingly increased with smaller power consumption, and thus stability of the memory cell can be improved.

Figure 2:
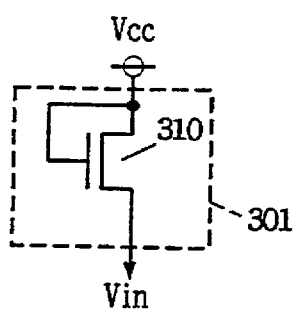
FIG. 2 is a schematic diagram of a voltage lowering circuit.

FIG. 2 is a schematic diagram showing the structure of the voltage lowering circuit 301 shown in FIG. 1. Voltage lowering circuit 301 includes an NMOS transistor 310 connected between the power supply potential Vcc and the lowered output potential Vin.

Assume that the threshold voltage of NMOS transistor 310 is |Vth|. Since transistors 310 has its gate and source connected to the power supply potential Vcc and its drain connected to the output potential Vin, when the difference between power supply potential Vcc and output potential Vin is larger than |Vth|, it turns on, while it turns off when the difference is smaller. Therefore, a potential which is always lower than the power supply potential Vcc by |Vth| is obtained as the output potential Vin.

(2) Second Embodiment

Figure 3:
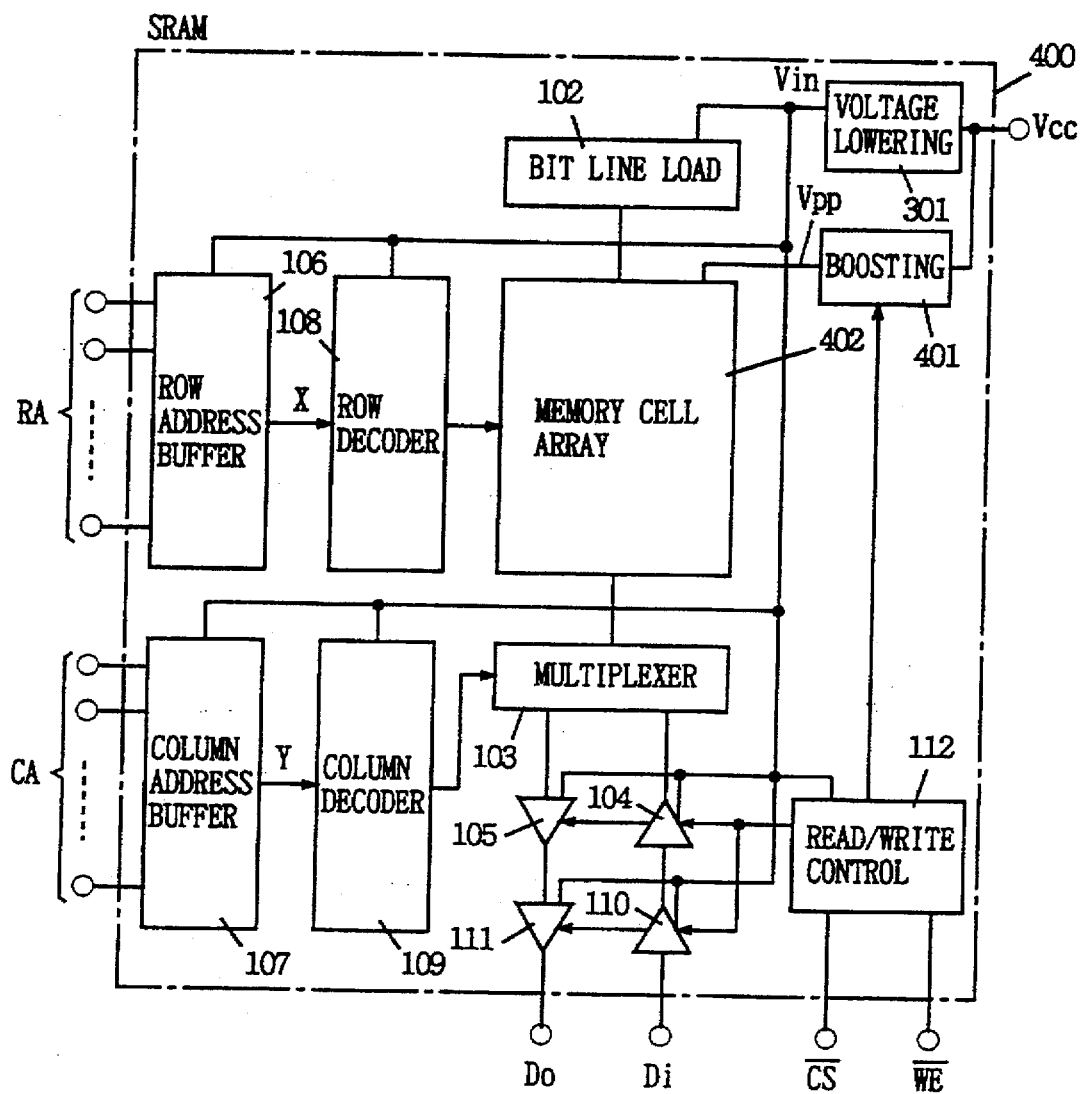
FIG. 3 is a block diagram of an SRAM in accordance with a second embodiment.

FIG. 3 is a block diagram of an SRAM showing a second embodiment of the present invention. Referring to FIG. 3, the SRAM 400 in accordance with the second embodiment includes a boosting circuit 401 connected to read/write control circuit 112 for changing an externally applied power supply potential Vcc; and a memory cell array 402 connected to the potential Vpp output from boosting circuit 401 as the power supply potential. Except boosting circuit 401 and memory cell array 402, other circuit structures of SRAM 400 are the same as those of SRAM 300 shown in FIG. 1, and therefore description thereof is not repeated.

Figure 4:
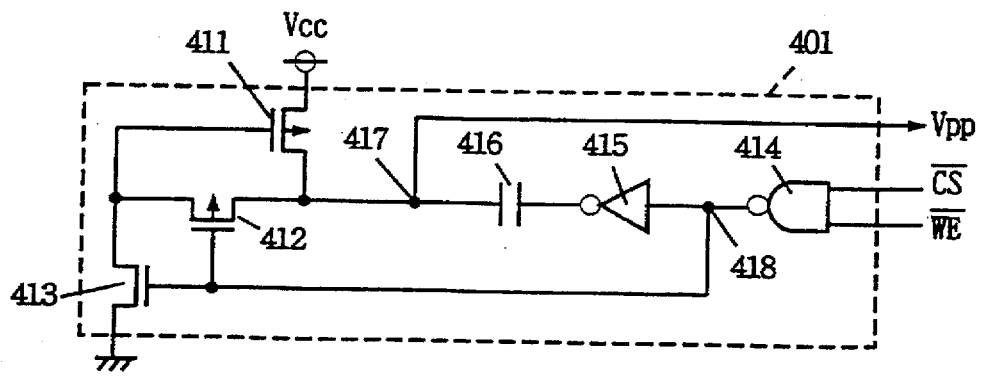
FIG. 4 is a schematic diagram of a boosting circuit.

FIG. 4 is a schematic diagram showing a structure of the boosting circuit 401 shown in FIG. 3. Referring to FIG. 4, boosting circuit 401 includes a PMOS transistor 411 connected between power supply potential Vcc and an output node 417 at the boosted output potential Vpp; a PMOS transistor 412 connected between output node 417 and the gate of PMOS transistor 411; and an NMOS transistor 413 connected between the ground potential and the gate of the PMOS transistor 411.

Further, boosting circuit 401 includes an NAND gate 414 to which a chip selection signal CS applied from read/write control circuit 112 and a write enable signal/WE are input; an inverter 415 receiving an output from NAND gate 414; and a capacitance 416 connected between the output of inverter 415 and an output potential Vpp. PMOS transistor 412 and NMOS transistor 413 have their gates connected to a node 418 provided between NAND gate 414 and inverter 415.

In boosting circuit 401, other than at the time of writing, NAND gate 414 outputs a signal of "H" level, and therefore NMOS transistor 413 turns on and the gate of PMOS transistor 411 is connected to the ground potential. PMOS transistor 411 is thus turned on. PMOS transistor 412 is turned off. Capacitance 416 is not charged. Therefore, potential Vpp provides directly the externally applied power supply potential Vcc.

However, at the time of writing, NAND gate 414 outputs "L" level, so that NMOS transistor 413 turns off, PMOS transistor 412 turns on and the gate of PMOS transistor 411 is connected to the potential Vpp through PMOS transistor 412. Capacitance 416 is gradually charged. Vpp is increased until the potential reaches Vcc plus Vth. As a result, at the time of reading, a potential Vpp higher than the externally applied power supply potential Vcc is applied as a power supply potential to memory cell array 202, and the power supply potential Vcc is applied to other circuits. Here, the threshold value Vth is the threshold value of PMOS transistor 411.

By providing such a circuit structure, only the power supply potential across the TFT constituting the memory cell array 402 can be set higher only at the time of reading. Therefore, by such a structure, the on current of TFT is seemingly increased at the time of reading despite of small power consumption in normal operation, and thus stability of the memory cell can be improved.

Figure 7:
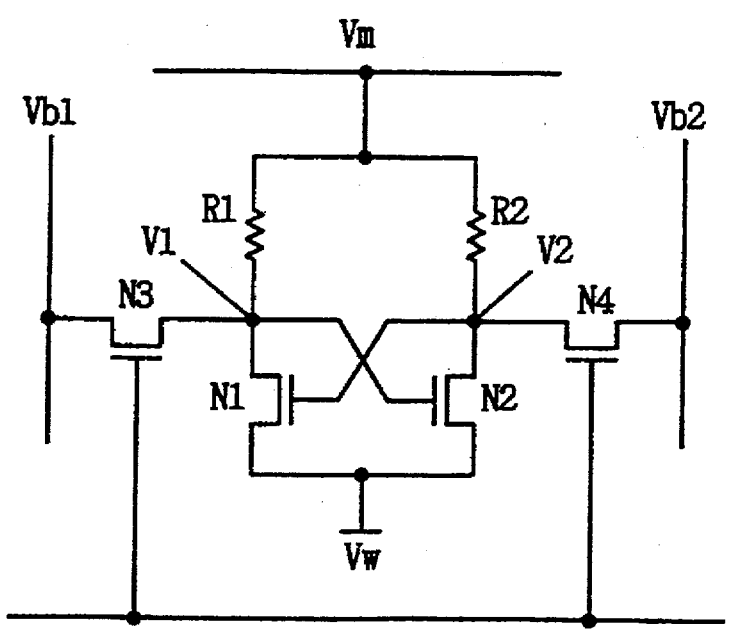
FIG. 7 is a schematic diagram of a high resistance type memory cell.

Though memory cells having small memory cell area constituting memory cell arrays 101 and 402 employed TFTs in the above described embodiments, the present invention is not limited thereto, and the present invention may also be applied when the memory cell of the high resistance type shown in FIG. 7 is used to provide the same effect.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory device receiving a power supply voltage having a first potential, the power supply voltage being applied to said static semiconductor memory device from an external power supply, comprising:

a static memory cell including a MOS transistor, the power supply voltage at the first potential being directly applied to the static memory cell;

a peripheral circuit portion operating said static memory cell; and voltage lowering means for preparing a second potential lower than said first potential as a voltage to be applied to said peripheral circuit portion.

2. The static semiconductor memory device according to claim 1, wherein said voltage lowering means includes a field effect transistor connected to a first terminal receiving said first potential and a second terminal providing said second potential, and operating in response to said first potential.

3. The static semiconductor memory device according to claim 2, wherein said field effect transistor includes an N channel MOS transistor which is diode connected by an application of said first potential to its one electrode and its control electrode.

4. The static semiconductor memory device according to claim 3, wherein said memory cell is a thin film transistor type memory cell.

5. The static semiconductor memory device according to claim 3, wherein said memory cell is a high resistance type memory cell.

6. The static semiconductor memory device according to claim 1, further comprising:

boosting means for outputting a third potential higher than said first potential, and supplying means for supplying said third potential to said static memory cell at the time of reading.

7. A static semiconductor memory device receiving a power supply voltage having a first potential, comprising:

a static memory cell including a MOS transistor;

a peripheral circuit portion operating said static memory cell;

voltage lowering means for preparing a second potential lower than said first potential as a voltage to be applied to said peripheral circuit portion; and boosting means for outputting a third potential higher than said first potential, and supplying means for supplying said third potential to said static memory cell at the time of reading, wherein said supplying means includes means for detecting the time of writing to said static memory cell, and charging means for charging, when said time of writing is detected, said first potential to said third potential.

8. The static semiconductor memory device according to claim 7, wherein said means for detecting the time of writing include an NAND circuit receiving a write enable signal indicating allowance of writing to said memory cell and a chip selection signal, and providing a negative logical product.

9. The static semiconductor memory device according to claim 7, wherein said memory cell is a thin film transistor type memory cell.

10. The static semiconductor memory device according to claim 7, wherein said memory cell is a high resistance type memory cell.

* * * * *